(12) United States Patent
Wu et al.

(10) Patent No.: US 7,510,991 B2
(45) Date of Patent: Mar. 31, 2009

(54) NOISE SUPPRESSOR FOR ELECTRONIC SIGNALS

(75) Inventors: Cheng-Cheng Wu, Taipei (TW);
Chien-Lung Chen, Taipei (TW);
Cheng-Fu Wu, Taipei (TW)

(73) Assignee: Y&L Technology Inc., Taipei (TW)

( * ) Notice: Subject to any disclaimer, the term of this patent is extended or adjusted under 35 U.S.C. 154(b) by 73 days.

(21) Appl. No.: 11/457,814

(22) Filed: Jul. 17, 2006

(65) Prior Publication Data

US 2007/0298959 A1 Dec. 27, 2007

(30) Foreign Application Priority Data

Jun. 23, 2006 (TW) .............................. 95122833 A

(51) Int. Cl.
*C04B 35/00* (2006.01)
*C04B 35/14* (2006.01)
*C04B 35/16* (2006.01)
*H04B 3/04* (2006.01)
*H04B 3/28* (2006.01)
*C04B 35/03* (2006.01)
*C04B 35/04* (2006.01)
*C04B 35/42* (2006.01)
*C04B 35/44* (2006.01)

(52) U.S. Cl. ....................... 501/128; 501/108; 501/112; 501/114; 501/117; 501/118; 501/119; 501/121; 501/122; 501/123; 501/125; 501/126; 501/127; 501/132; 501/133; 333/12; 333/20

(58) Field of Classification Search ................. 501/127; 336/175

See application file for complete search history.

(56) References Cited

U.S. PATENT DOCUMENTS 3,791,833 A * 2/1974 Sugiura et al. ............... 501/153
4,972,167 A * 11/1990 Fujioka ........................ 336/92

* cited by examiner

*Primary Examiner*—Jerry Lorengo
*Assistant Examiner*—Kevin M Johnson
(74) *Attorney, Agent, or Firm*—Squire, Sanders & Dempsey, L.L.P.

(57) ABSTRACT

The present invention is directed to a noise suppressor for electronic signals. The noise suppressor at least includes Aluminum Oxide ($Al_2O_3$) that is sintered under high temperature, resulting in ceramic Aluminum Oxide ($Al_2O_3$) for effectively absorbing or suppressing noise, and reshaping the waveform or filtering waveform glitch of the electronic signals.

4 Claims, 5 Drawing Sheets

NOISE SUPPRESSOR FOR ELECTRONIC SIGNALS

CROSS-REFERENCE TO RELATED APPLICATION

This application claims priority benefit under 35 USC 119 of Taiwan Patent Application No. 95,122,833, filed on Jun. 23, 2006, by the same Applicant, and is incorporated herein by this reference.

BACKGROUND OF THE INVENTION

1. Field of the Invention

The present invention generally relates to a noise suppressor for electronic signals, and more particularly to a noise suppressor containing Aluminum Oxide ($Al_2O_3$) that is sintered under high temperature and then becomes ceramic Aluminum Oxide ($Al_2O_3$).

2. Description of the Prior Art

In traditional audio components or audio devices, such as players, amplifiers, speakers, microphones, earphones, cellular phones, sound cards in computers, wireless audio devices, television sets, or transmission cables, electronic signals are liable to external environment, such as radio frequency (RF), static electricity, or radiation in ambient air, therefore resulting in noise. The electronic signals are also liable to the noise generated in the transmission cables or electronic components/circuits in the audio devices, therefore decreasing the quality of sound or even resulting in distortion.

Take transmission cables of a home audio equipment for example. As the electronic signals processed by the player and the power amplifier are outputted and sent to speakers via the transmission cables, the impedance, capacitance, and inductance phenomena of the transmission cables may degrade the electronic signals and cause phase mismatch between right and left channel. Furthermore, the aforementioned external environment and the electronic components/circuits in the audio devices may also cause to attach a multitude of noises to the electronic signals. The disadvantages mentioned above may be improved by utilizing specific transmission cables with high transmission efficiency and utilizing shielded cables. However, such practice is costly and extravagant, and thus is generally not a plausible one. Further, the problems still maintain while the noises generated by the aforementioned external environment and the electronic components/circuits in the audio devices could not be overcome by the specific cables.

In addition to the audio components and audio devices, the fields other than the audio, such as the process or transmission of electronic signals in video components or devices, possess similar problems to be conquered. For the reasons discussed above, a need has arisen to propose an uncomplicated and efficient noise suppressor for electronic signals to lessen noise interference on the electronic signals during their process and transmission.

SUMMARY OF THE INVENTION

In view of the foregoing, it is an object of the present invention to provide a noise suppressor for electronic signals for effectively absorbing or suppressing noise, and for reshaping the waveform or filtering waveform glitch of the electronic signals.

According to the object, the present invention provides a noise suppressor for electronic signals. The noise suppressor at least includes Aluminum Oxide ($Al_2O_3$) that is sintered under high temperature and then becomes ceramic Aluminum Oxide ($Al_2O_3$) for recovering the electronic signals through absorbing or suppressing noise, and reshaping the waveform or filtering waveform glitch of the electronic signals.

DETAILED DESCRIPTION OF THE INVENTION

Figure 1:
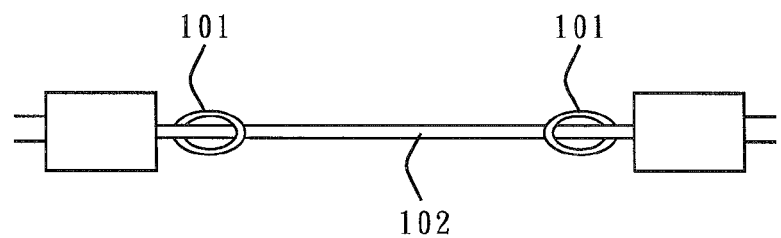
FIG. 1 illustrates that noise suppressors are utilized with a transmission cable according to one embodiment of the present invention.

The detailed description of the present invention will be discussed in the following embodiments, which are not intended to limit the scope of the present invention, but can be adapted for other applications.

The noise suppressor for electronic signals of the present invention primarily includes Aluminum Oxide ($Al_2O_3$) and other oxide or oxides in powder form. These powdered oxides are evenly mixed with a predetermined ratio between/among these oxides. The mixed oxides are then molded by a mold, and then are sintered or fired under a high temperature enough to transform the Aluminum Oxide ($Al_2O_3$) and other oxide(s) to ceramics. During the process, the physical characteristics, such as magnetism or frequency-related attributes of the oxides are altered. The resultant noise suppressor is capable of recovering the electronic signals through absorbing or suppressing noise, and reshaping the waveform or filtering waveform glitch of the electronic signals. Although the following embodiments will be exemplified by audio components or audio devices, such as players, amplifiers, speakers, microphones, earphones, cellular phones, sound cards in computers, wireless audio devices, television sets, or transmission cables, it is appreciated that the present invention is well adaptable to fields other than the audio, such as the process or transmission of electronic signals in video components or devices. Because the field of audio electronic signals process and transmission has common features to the field of video electronic signals process and transmission as well known in these fields, the present specification therefore only illustrates manifestation in the audio field.

In the embodiment of the present invention, the noise suppressor includes Aluminum Oxide ($Al_2O_3$) and one or more of the following ingredients: Ferric Oxide ($Fe_2O_3$), Manganese Oxide (MnO), and Silicon Oxide ($SiO_2$). In other embodiment of the present invention, in addition to Aluminum Oxide ($Al_2O_3$), one or more further ingredients could be included as follows: Cobalt Oxide ($Co_3O_4$), Nickel Oxide (NiO), Chromium Oxide ($Cr_2O_3$), Copper Oxide (CuO), Titanium Oxide ($TiO_2$), Magnesium Oxide (MgO), and Calcium Oxide (CaO). It is appreciated that the noise suppressor of the present invention could include ingredient(s) other than those mentioned above. It is respectfully noted that the characteristics of the aforementioned ingredients are not necessarily similar or obvious to each other; in other words, individual ingredient could have its specific characteristics, and could distinctly contribute to the noise suppressor. Moreover, the order of the aforementioned ingredients does not necessarily imply the degree of their importance. Following is one specific embodiment of the present invention, illustrating its main ingredients with weight percentage range (wt %):

| | |
|---|---|
| Aluminum Oxide ($Al_2O_3$) | 70-95 |
| Ferric Oxide ($Fe_2O_3$) | 1.0-4.0 |
| Manganese Oxide (MnO) | 0.7-3.5 |
| Silicon Oxide ($SiO_2$) | 0.7-3.5 |
| Cobalt Oxide ($Co_3O_4$) | 0.5-3.0 |
| Nickel Oxide (NiO) | 0.5-3.0 |
| Chromium Oxide ($Cr_2O_3$) | 0.3-3.0 |
| Copper Oxide (CuO) | 0.3-3.0 |
| Titanium Oxide ($TiO_2$) | 0.3-3.0 |
| Magnesium Oxide (MgO) | less than 1.5 |
| Calcium Oxide (CaO) | less than 1.0 |

According to one embodiment of the present invention, the process of manufacturing the noise suppressor for electronic signals is specifically described in the following. First of all, some or all of the aforementioned ingredients or other further ingredient(s) are prepared in powder form, which are then evenly mixed with a predetermined ratio between/among these ingredients. Subsequently, the mixed ingredients are then molded by a mold, preferably by a mold having a specific shape. For example, shape of a ring, a slice, a stick, a pin, a board, a hollow cylinder, a solid cylinder, or other suitable shapes could be individually adaptable to diverse applications. Finally, the molded ingredients are sintered under a high temperature in, for example, a kiln, such as an electrical tunnel kiln, thereby resulting in the noise suppressor for electronic signals. More specifically, the sinter process includes the following three stages (or steps): a heating stage, a steady temperature stage, and a cooling stage. In the heating stage, the temperature of the kiln is increased from room temperature toward 1350-1650° C. in about 12-18 hours; in the steady temperature stage, the temperature of the kiln is maintained at 1350-1650° C. for about 4-8 hours; and in the cooling stage, the temperature of the kiln is decreased from 1350-1650° C. toward room temperature in 4-8 hours. In the embodiment of the present invention, the "high temperature" is preferably, but not limited to, 1350-1650° C. Generally, the "high temperature" in this specification refers to a temperature that sufficiently transforms the Aluminum Oxide ($Al_2O_3$) and other oxide(s) into ceramics with capability of suppressing the noise for electronic signals. In some practices, the resultant ceramics according to the above process may be further ground into powder form, which is adhesively attached to some place where noise needs to be suppressed. For example, the ground powder could be adhesively attached by means of glue or tape unto a place where noise needs to be suppressed.

Figure 2:
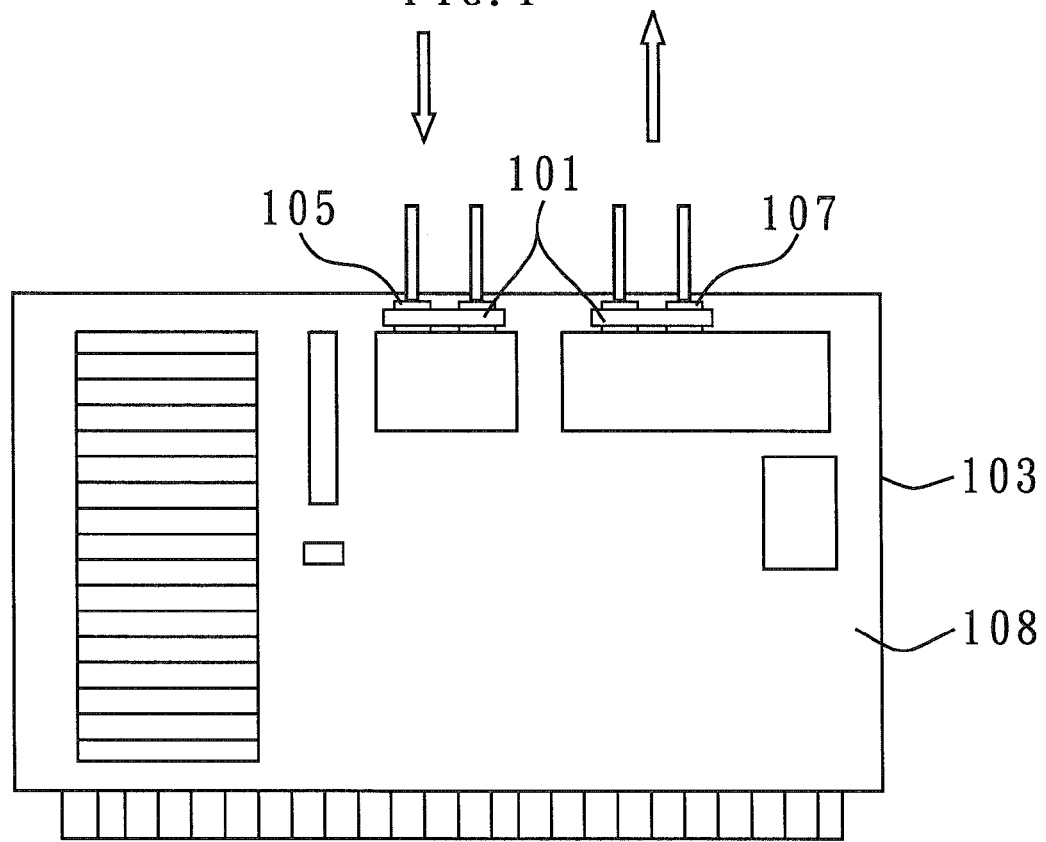
FIG. 2 illustrates that noise suppressors are utilized with an audio circuit board according to another embodiment of the present invention.

FIG. 1 and FIG. 2 respectively demonstrate exemplary applications of the noise suppressor according to embodiments of the present invention. FIG. 1 illustrates that the noise suppressors are utilized with a transmission cable. The noise suppressors 101 of ring shape are respectively fixed at the ends of the transmission cable 102, which is connected between, for example, a player and an amplifier, or an amplifier and a speaker. It is appreciated that the shape of the noise suppressor 101 is not limited to the ring. For example, a noise suppressor having the shape of a slice could be used to wrap the transmission cable 102, or a noise suppressor having the shape of a stick could be used to bind with the transmission cable 102. Accordingly, the noise of the electronic signals through the transmission cable 102 could be substantially decreased or suppressed. In one of the aforementioned examples, the noise suppressors 101 of ring shape are respectively fixed at the ends of the transmission cable 102, which is connected between a player and an amplifier, and therefore the waveform glitch of the small signal of the electronic signals in the transmission cable 102 could be filtered out. In another of the aforementioned examples, the noise suppressors 101 of ring shape are respectively fixed at the ends of the transmission cable 102, which is connected between an amplifier and a speaker, and therefore the waveform glitch of the large signal of the electronic signals in the transmission cable 102 could also be filtered out.

FIG. 2 illustrates that the noise suppressors are utilized with an audio circuit board. The noise suppressors 101 of board shape or stick shape are respectively fixed or stuck to input connector 105 and output connector 107 to filter or suppress the noise of the amplifier 103. For a better effect, further noise suppressor of board shape, stick shape, slice shape, or powder could be applied on the integrated circuits or wire trace of the audio circuit board 108.

Figure 3A:
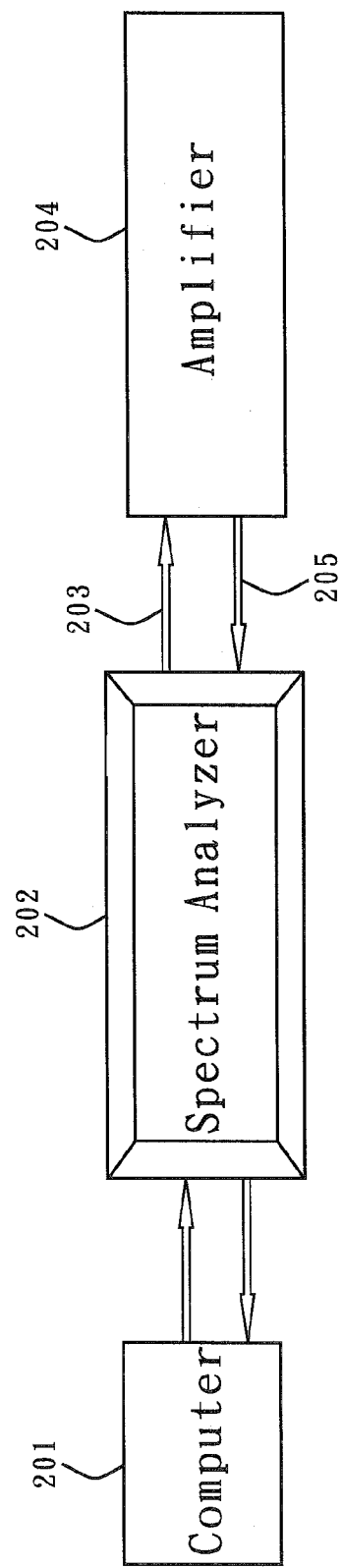
FIGS. 3A-3C show test results substantiating the ramifications of the embodiment of the present invention, which is directed to analog electronic signals that are tested under a setup shown in FIG. 3A, with the test result without noise suppressor as shown in FIG. 3B and the test result with noise suppressor as shown in FIG. 3C.
Figure 3B:
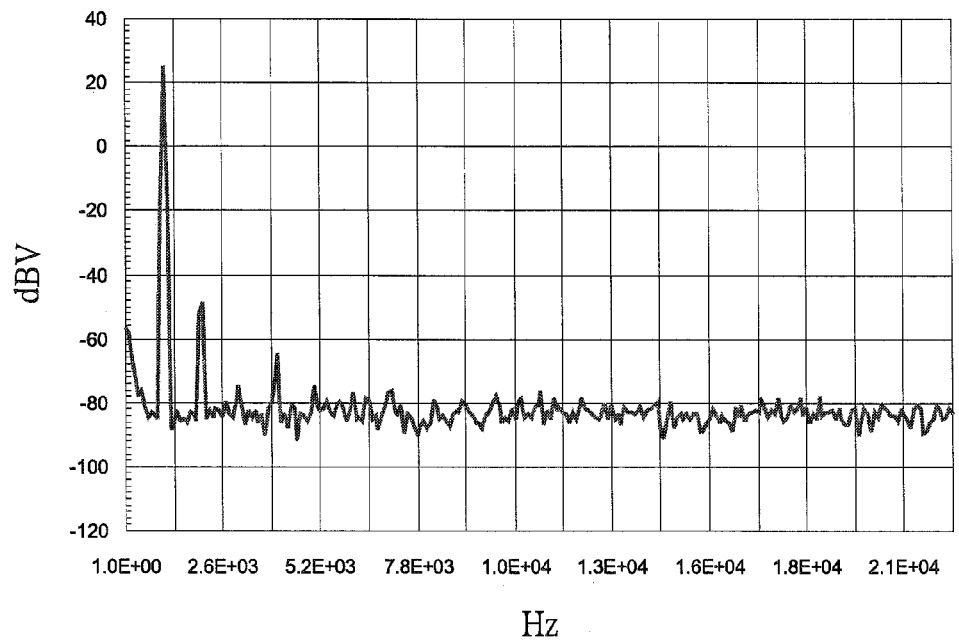
Figure 3C:
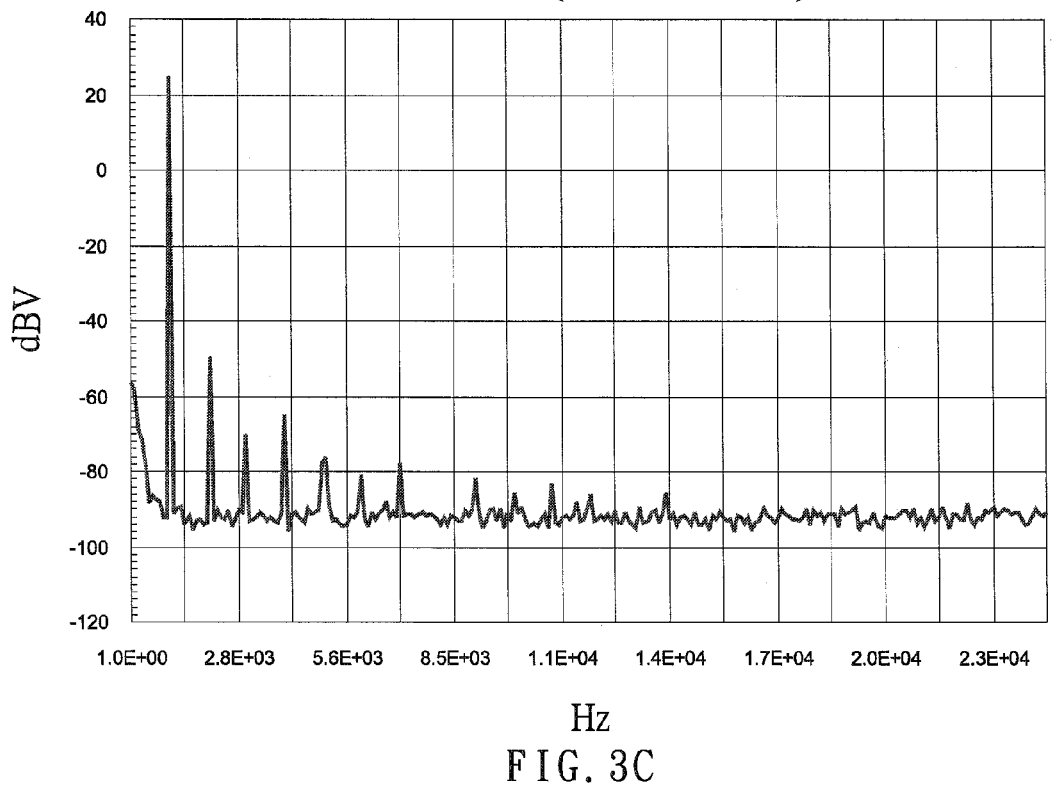

FIGS. 3A-3C and FIGS. 4A-4C show test results substantiating the ramifications of the embodiments of the present invention. FIGS. 3A-3C are directed to analog electronic signals that are tested under a setup shown in FIG. 3A, with the test result without noise suppressor as shown in FIG. 3B and the test result with noise suppressor as shown in FIG. 3C. Referring to FIG. 3A, a computer 201 controls a spectrum analyzer 202 to output an analog test signal having frequency 1 kHz, which is sent to an amplifier 204 via a first transmission cable 203. The analog test signal is processed by the amplifier 204, and is then sent back to the spectrum analyzer 202 via a second transmission cable 205 for examining the spectral composition of the processed signal. In this embodiment, the spectrum analyzer 202 is an "Audio Precision System Two Audio Analyzer" made by Audio Precision, a US company. This spectrum analyzer 202 uses the Fast Fourier transform (FFT) to transform a waveform into the components of its frequency spectrum and to make examining the characteristics of the signal easier. Comparing FIG. 3B (the test result without noise suppressor) to FIG. 3C (the test result with noise suppressor), the noise suppressor of the present embodiment decreases the noise level from about −80 dBV (FIG. 3B) to about −90 dBV (FIG. 3C). The following Table 1 specifically lists some data from the test results of FIG. 3B and FIG. 3C.

TABLE 1

| Frequency (Hz) | Noise level (dBV) without noise suppressor | Noise level (dBV) with noise suppressor |
|---|---|---|
| 8.48E+02 | −84.85 | −92.32 |
| 9.42E+02 | −21.35 | −92.03 |
| 1.036E+03 | 25.03 | 24.94 |
| 1.130E+03 | −12.84 | −91.16 |
| 1.224E+03 | −88.31 | −89.97 |

According to Table 1, the noise level after using the noise suppressor is substantially smaller than the noise level without using noise suppressor. For example, the noise level at 942 Hz after using the noise suppressor is −92.03 dBV, which is smaller than −21.35 dBV without noise suppressor. The noise level at 1130 Hz after using the noise suppressor is −91.16 dBV, which is smaller than −12.84 dBV without noise suppressor. Accordingly, the use of the noise suppressor effectively decreases the noise and improves sound quality.

Figure 4A:
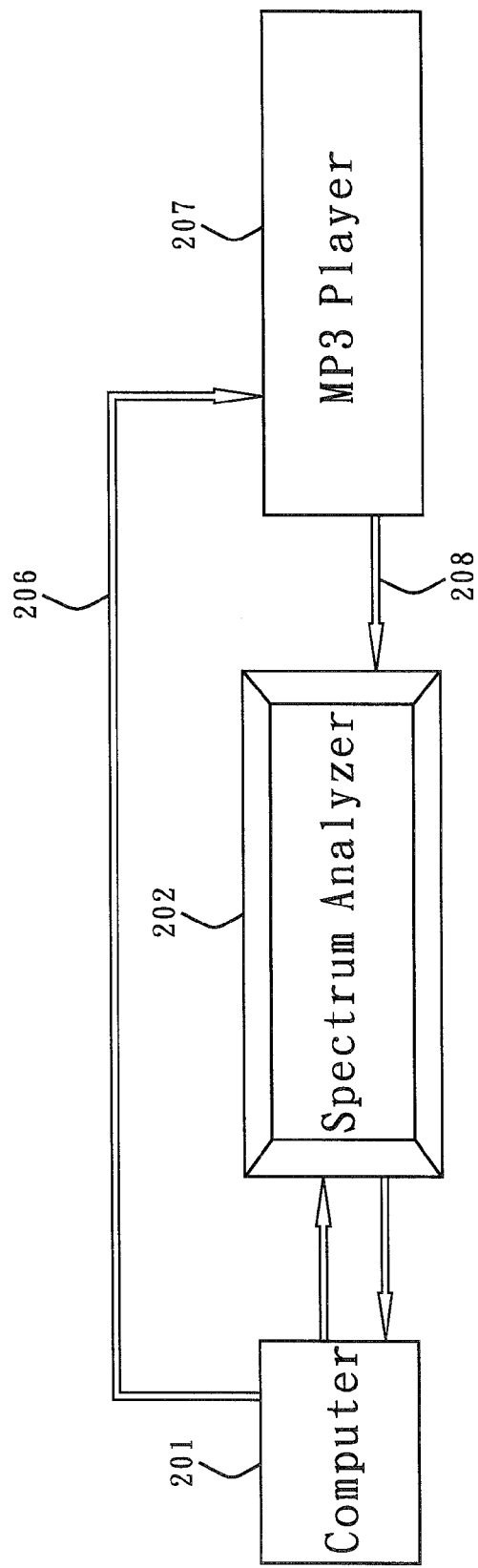
FIGS. 4A-4C show test results substantiating the ramifications of the embodiment of the present invention, which is directed to digital electronic signals that are tested under a setup shown in FIG. 4A, with the test result without noise suppressor as shown in FIG. 4B and the test result with noise suppressor as shown in FIG. 4C.
Figure 4B:
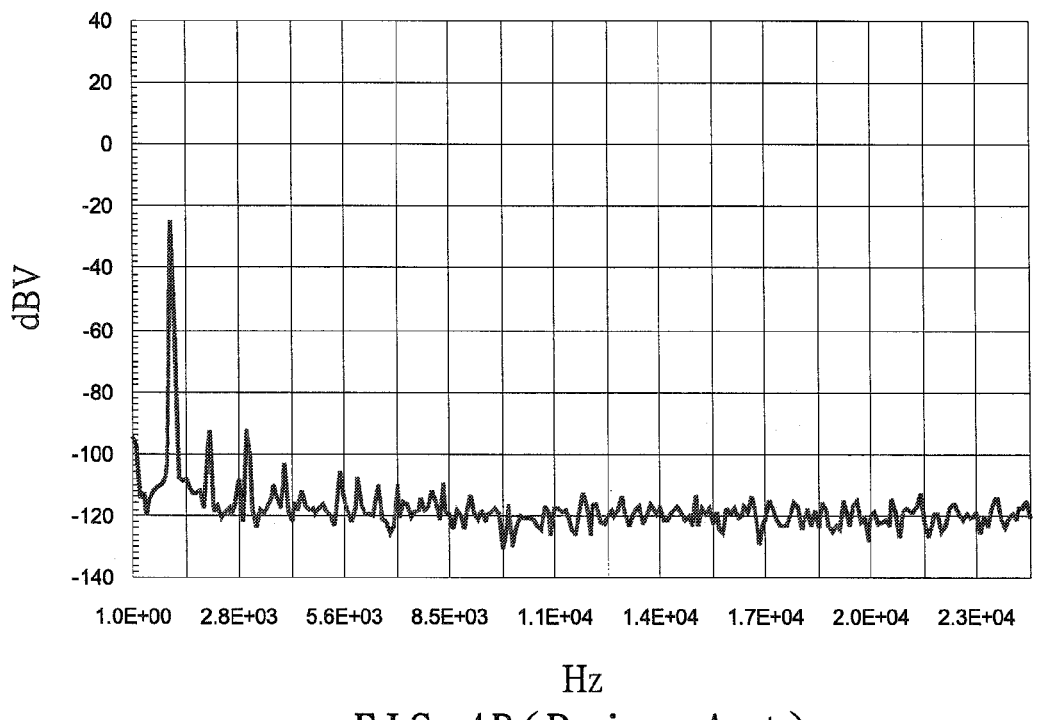
Figure 4C:
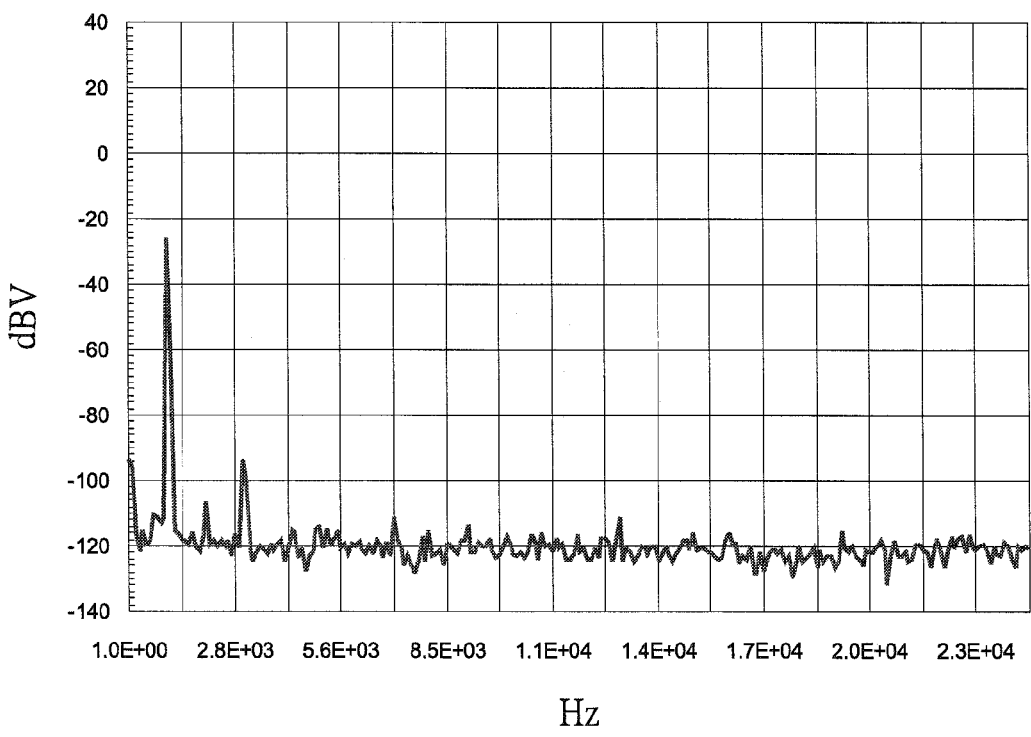

FIGS. 4A-4C are directed to digital electronic signals that are tested under a setup shown in FIG. 4A, with the test result without noise suppressor as shown in FIG. 4B and the test result with noise suppressor as shown in FIG. 4C. Referring to FIG. 4A, a spectrum analyzer 202 sends an analog signal having frequency 1 kHz to a computer 201, which then encodes the analog signal into a digital test signal in Moving Picture Experts Group Audio Layer 3 (MP3) format and sends the digital test signal to an MP3 player 207 via a first transmission cable 206 and a Universal Serial Bus (USB) input port (not shown in the figure). The digital test signal is played back by the MP3 player 207, and is sent back to the spectrum analyzer 202 via a second transmission cable 208 for examining the spectral composition of the play-back signal. Comparing FIG. 4B (the test result without noise suppressor) to FIG. 4C (the test result with ring-shape noise suppressor fixed to the USB port), the noise suppressor of the present embodiment decreases the noise level from above −120 dBV (FIG. 4B) to below −120 dBV (FIG. 4C). The following Table 2 specifically lists some data from the test results of FIG. 4B and FIG. 4C.

TABLE 2

| Frequency (Hz) | Noise level (dBV) without noise suppressor | Noise level (dBV) with noise suppressor |
|---|---|---|
| 8.48E+02 | −107.88 | −113.17 |
| 9.42E+02 | −103.42 | −111.48 |
| 1.036E+03 | −24.93 | −25.73 |
| 1.130E+03 | −58.98 | −59.78 |
| 1.224E+03 | −107.50 | −115.28 |

According to Table 2, the noise level after using the noise suppressor is substantially smaller than the noise level without using noise suppressor. For example, the noise level at 942 Hz after using the noise suppressor is −111.48 dBV, which is smaller than −103.42 dBV without noise suppressor. The noise level at 1224 Hz after using the noise suppressor is −115.28 dBV, which is smaller than −107.50 dBV without noise suppressor. Accordingly, the use of the noise suppressor effectively decreases the noise and improves sound quality.

Although specific embodiments have been illustrated and described, it will be appreciated by those skilled in the art that various modifications may be made without departing from the scope of the present invention, which is intended to be limited solely by the appended claims.

What is claimed is:

1. A noise suppressor for effectively absorbing or suppressing noise, and reshaping or filtering the waveform glitch of electronic signals, said noise suppressor comprising Aluminum Oxide ($Al_2O_3$) and several ingredients that are sintered under high temperature to transform the Aluminum Oxide ($Al_2O_3$) and said ingredients to ceramics with capability of suppressing noise of electronic signals, wherein said noise suppressor is attached to a place where the noise needs to be suppressed, and the Aluminum Oxide ($Al_2O_3$) and said ingredients are present in the following weight percentages:

Aluminum Oxide ($Al_2O_3$) 70-95;
Ferric Oxide ($Fe_2O_3$) 1.0-4.0;
Manganese Oxide (MnO) 0.7-3.5;
Silicon Oxide ($SiO_2$) 0.7-3.5;
Cobalt Oxide ($Co_3O_4$) 0.5-3.0;
Nickel Oxide (NiO) 0.5-3.0;
Chromium Oxide ($Cr_2O_3$) 0.3-3.0;
Copper Oxide (CuO) 0.3-3.0;
Titanium Oxide ($TiO_2$) 0.3-3.0;
Magnesium Oxide (MgO) less than 1.5; and
Calcium Oxide (CaO) less than 1.0.

2. The noise suppressor for electronic signals according to claim 1, wherein said high temperature is about 1350-1650° C.

3. The noise suppressor for electronic signals according to claim 1 wherein said noise suppressor has a shape of a ring, a slice, a stick, a pin, a board, a hollow cylinder, or a solid cylinder.

4. The noise suppressor for electronic signals according to claim 1, wherein said noise suppressor is in powder form.

* * * * *